US009236451B2

(12) United States Patent
Jung et al.

(10) Patent No.: US 9,236,451 B2
(45) Date of Patent: Jan. 12, 2016

(54) METHOD OF FABRICATING ARRAY SUBSTRATE USING DRY ETCHING PROCESS OF SILICON NITRIDE

(71) Applicant: LG DISPLAY CO., LTD., Seoul (KR)

(72) Inventors: Young-Sup Jung, Seoul (KR); Jun-Hee Lee, Incheon-si (KR); Jin-Hyun Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 13/692,078

(22) Filed: Dec. 3, 2012

(65) Prior Publication Data

US 2013/0149818 A1 Jun. 13, 2013

(30) Foreign Application Priority Data

Dec. 13, 2011 (KR) .......................... 10-2011-0133760

(51) Int. Cl.
*H01L 21/3065* (2006.01)
*H01L 29/66* (2006.01)
*H01L 27/12* (2006.01)

(52) U.S. Cl.
CPC ...... *H01L 29/66742* (2013.01); *H01L 27/1248* (2013.01); *H01L 27/1288* (2013.01)

(58) Field of Classification Search
CPC ................... H01L 21/3065; H01L 21/31116; H01L 21/76224; H01L 29/786; H01L 29/78603; H01L 29/66742
USPC ......................................... 438/158
See application file for complete search history.

(56) References Cited

U.S. PATENT DOCUMENTS

| | | | | |
|---|---|---|---|---|
| 6,475,860 | B2 * | 11/2002 | Kwon et al. | 438/253 |
| 7,307,025 | B1 * | 12/2007 | Worsham et al. | 438/711 |
| 2007/0218577 | A1 * | 9/2007 | Ahn et al. | 438/30 |
| 2008/0038927 | A1 * | 2/2008 | Yamaguchi et al. | 438/706 |
| 2008/0090408 | A1 * | 4/2008 | Hoster et al. | 438/637 |
| 2010/0148169 | A1 * | 6/2010 | Kim et al. | 257/43 |
| 2012/0238102 | A1 * | 9/2012 | Zhang et al. | 438/718 |
| 2013/0045605 | A1 * | 2/2013 | Wang et al. | 438/723 |

OTHER PUBLICATIONS

First Notification of Office Action dated Jun. 30, 2014 from the State Intellectual Property Office of China in counterpart Chinese application No. 201210539707.0.

* cited by examiner

*Primary Examiner* — Julia Slutsker
*Assistant Examiner* — Natalia Gondarenko
(74) *Attorney, Agent, or Firm* — Morgan, Lewis & Bockius LLP

(57) ABSTRACT

A method of fabricating an array substrate includes: forming a line or an electrode on a substrate on which a pixel region is defined, forming a protection layer on the line or the electrode, the protection layer formed of silicon nitride ($SiN_x$), forming photoresist patterns on the protection layer, and loading the substrate having the photoresist pattern into a chamber of a dry etching apparatus, and performing a first dry etching process on the protection layer exposed between the photoresist patterns using a first gas mixture containing nitrogen trifluoride ($NF_3$) gas to form a contact hole exposing the line or the electrode.

7 Claims, 12 Drawing Sheets

METHOD OF FABRICATING ARRAY SUBSTRATE USING DRY ETCHING PROCESS OF SILICON NITRIDE

The present application claims the priority benefit of Korean Patent Application No. 10-2011-0133760 filed in the Republic of Korea on Dec. 13, 2011, which are hereby incorporated by reference in their entirety.

BACKGROUND

1. Field of the Disclosure

The present disclosure relates to a method of fabricating an array substrate including performing a dry etching process using nitrogen trifluoride ($NF_3$) gas.

2. Discussion of the Related Art

In recent years, with the advent of an information-oriented society, the field of display devices configured to process and display a large amount of information has rapidly been developed. Liquid crystal displays (LCDs) or organic light emitting diodes (OLEDs) have lately been developed as flat panel displays (FPDs) having excellent performance, such as a small thickness, light weight, and low power consumption, and has superseded conventional cathode-ray tubes (CRTs).

Among LCDs, an active matrix (AM)-type LCD including an array substrate having a TFT serving as a switching element capable of controlling on/off voltages of each of pixels may have excellent resolution and capability of embodying moving images.

In addition, since an OLED is an emissive display having high luminance and low operating voltage characteristics, the OLED has a high contrast ratio and may be made ultrathin. Also, the OLED may be easily capable of embodying moving images due to a response time of several microseconds ($\mu s$), have an unlimited viewing angle, be stable at a low temperature, and operate at a low direct-current (DC) voltage of about 5 to 15V, thereby facilitating manufacture and design of driver circuits. For the above-described reasons, the OLED has lately attracted much attention as an FPD.

LCDs and OLEDs equally require array substrates including thin-film transistors (TFTs) serving as switching elements to turn respective pixel regions on and off.

FIG. 1 is a cross-sectional view of a conventional array substrate 11 of an LCD or an OLED, which illustrates a TFT formed in one pixel region.

As shown in FIG. 1, a plurality of gate lines (not shown) and a plurality of data lines 33 may be formed on an array substrate 11, and a plurality of pixel regions P are defined by intersection of the gate lines and the data lines 33. A gate electrode 15 may be formed in a switch region TrA of each of the plurality of pixel regions P. Also, a gate insulating layer 18 may be formed on the entire surface of the resultant structure to cover the gate electrode 15, and a semiconductor layer 28 including an active layer 22 formed of pure amorphous silicon (a-Si), and an ohmic contact layer 26 formed of doped a-Si may be sequentially formed on the gate insulating layer 18. A source electrode 36 and a drain electrode 38 may be formed on the ohmic contact layer 26 to correspond to the gate electrode 15, and spaced apart from each other. In this case, the gate electrode 15, the gate insulating layer 18, the semiconductor layer 28, and the source and drain electrodes 36 and 38, which may be sequentially stacked on the switching region TrA, may constitute a TFT Tr.

Furthermore, a protection layer 42 including a drain contact hole 45 exposing the drain electrode 38 may be formed on the entire surface of the resultant structure to cover the source and drain electrodes 36 and 38 and the exposed active layer 22. A pixel electrode 50 may be separately formed in each of pixel regions P on the protection layer 42 and in contact with the drain electrode 38 through the drain contact hole 45.

Fabrication of the array substrate 11 having the above-described construction may involve a mask process.

The mask process may include a plurality of unit processes, such as processes of coating photoresist on a material layer required for a patterning process, exposing the photoresist using an exposure mask, developing the exposed photoresist, etching the material layer, and stripping the photoresist.

For example, the mask process may be performed to pattern the protection layer 42 formed of an inorganic insulating material, and form the drain contact hole 45 for exposing the drain electrode 38 of the TFT Tr.

In general, the protection layer 42 may be formed of an inorganic insulating material, such as silicon nitride ($SiN_x$). The patterning of the protection layer 42 formed of silicon nitride may include performing a dry etching process within a vacuum chamber using a reactive gas. A gas mixture containing sulfur hexafluoride ($SF_6$) gas may be used as the reactive gas for the dry etching process.

However, to prevent global warming, attempts at inhibiting use of gases (hereinafter, referred to as "greenhouse gases") contributing toward global warming or proposing the amounts of greenhouse gases used have been made.

Specifically, as examples of measures for inhibiting global warming, a greenhouse gas emission trading system will come into effect in 2015, and a greenhouse gas target management system will come into effect in 2012.

However, sulfur hexafluoride gas, which is used as a reactive gas for dry etching silicon nitride (SiNx), has a global warming potential (GWP) of 23,900, and is classified as a greenhouse gas having the highest GWP of greenhouse gases. Here, GWP is a relative measure of global warming caused by greenhouse gases when the GWP of carbon dioxide is standardized to 1.

Accordingly, the use of sulfur hexafluoride is suppressed. When sulfur hexafluoride gas is continuously used and exceeds a decided amount, greenhouse development rights (GDR) corresponding to the excessed amount should be additionally purchased, or the excessed sulfur hexafluoride gas should be reprocessed and modified into a non-greenhouse gas or a gas having a low GWP, and emitted.

To modify sulfur hexafluoride gas into a non-greenhouse gas or a gas having a low GWP, a greenhouse gas reprocessing system, such as a thermal decomposition system, should be additionally prepared, and additional costs may be incurred to operate the system. Therefore, fabrication costs of final products may increase to degrade price competitiveness.

Accordingly, it is necessary to replace sulfur hexafluoride gas with another reactive gas, or reduce the amount of sulfur hexafluoride gas used during a dry etching process for patterning the protection layer 42 formed of silicon nitride.

SUMMARY OF THE INVENTION

Accordingly, the present invention is directed to a display device that substantially obviates one or more of the problems due to limitations and disadvantages of the related art.

An object of the present disclosure is to provide a method of fabricating an array substrate, which may not use sulfur hexafluoride ($SF_6$) acting as a greenhouse gas, but a non-greenhouse gas as a reactive gas capable of patterning a silicon nitride (SiNx)-based insulating layer to inhibit the use of sulfur hexafluoride acting as the greenhouse gas or reduce the amount of sulfur hexafluoride used. Simultaneously, the method of fabricating the array substrate according to the present invention may allow the reactive gas to have about the same etch rate as currently used sulfur hexafluoride gas to obtain about the same productivity per unit time as sulfur hexafluoride. Furthermore, the method of fabricating the array substrate according to the present invention may prevent the reactive gas from affecting a metal-based line or electrode exposed through a drain contact hole.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an array substrate includes: forming a line or an electrode on a substrate on which a pixel region is defined, forming a protection layer on the line or the electrode, the protection layer formed of silicon nitride ($SiN_x$), forming photoresist patterns on the protection layer, and loading the substrate having the photoresist pattern into a chamber of a dry etching apparatus, and performing a first dry etching process on the protection layer exposed between the photoresist patterns using a first gas mixture containing nitrogen trifluoride ($NF_3$) gas to form a contact hole exposing the line or the electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

One feature of the embodiment of the present invention is to perform a dry etching process for forming a contact hole on a protection layer formed of silicon nitride ($SiN_x$) using nitrogen trifluoride ($NF_3$) instead of sulfur hexafluoride ($SF_6$).

Since nitrogen trifluoride has a global warming potential (GWP) of 17,200, which is about ⅔ that of sulfur hexafluoride, and has a self-decomposition rate of 97% during a dry etching process performed using plasma in a chamber, only 3% of nitrogen trifluoride may contribute toward global warming, greenhouse emissions may be greatly reduced in comparison with the use of sulfur hexafluoride.

Sulfur hexafluoride has a GWP of 23,900 and a self-decomposition rate of about 70% in a chamber during a dry etching process using plasma. Thus, 30% of the amount of sulfur hexafluoride used may affect global warming.

Accordingly, assuming that nitrogen trifluoride is used in the same amount as sulfur hexafluoride, the emission of nitrogen trifluoride having about ⅔ the GWP of sulfur hexafluoride and a self-decomposition rate of 97%, may be far smaller than that of sulfur hexafluoride so that nitrogen trifluoride can produce marked effects on inhibiting global warming. Also, investments in decomposition apparatuses may be reduced, thereby dropping fabrication costs of products.

Reference will now be made in detail to the preferred embodiments, examples of which are illustrated in the accompanying drawings.

Embodiment 1

FIGS. 2A through 2I are cross-sectional views illustrating processes of a method of fabricating one pixel region of an array substrate according to a first embodiment of the present invention. In this case, a portion of each of pixel regions P in which a thin-film transistor (TFT) Tr is formed will be defined as a switching region TrA.

Figure 1:
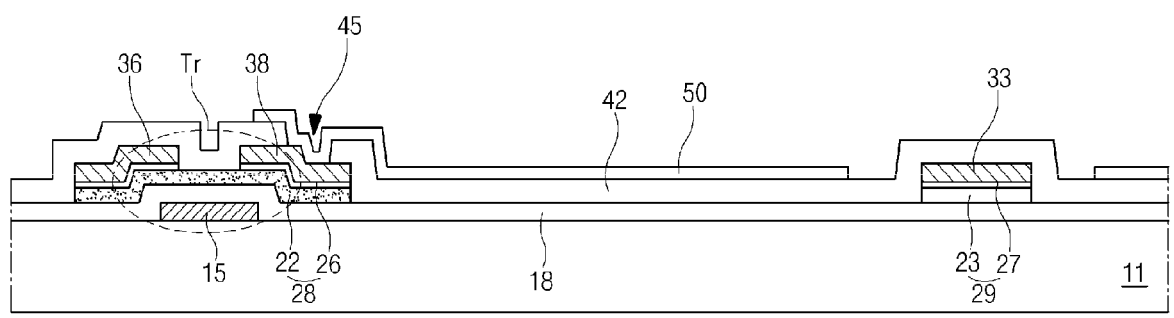
FIG. 1 is a cross-sectional view of a conventional array substrate 11 of a light crystal display (LCD) or an organic light emitting diode (OLED), which illustrates a thin-film transistor (TFT) formed in one pixel region.
Figure 2A:
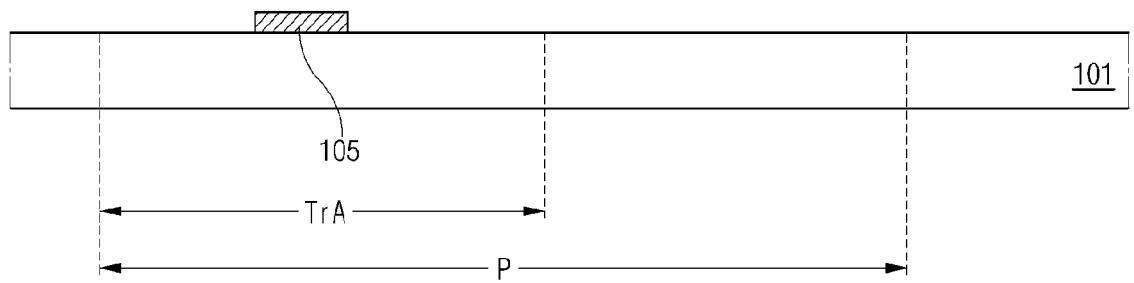
FIGS. 2A through 2O are cross-sectional views illustrating processes of a method of fabricating one pixel region of an array substrate according to a first embodiment of the present invention.

To begin with, as shown in FIG. 2A, a metal material having low-resistance characteristics, for example, at least one of aluminum (Al), an aluminum alloy (e.g., aluminum-neodymium (AlNd)), molybdenum (Mo), and molybdenum titanium (MoTi), may be deposited on a transparent insulating substrate 101 to form a first metal layer having a single or multilayered layer structure.

In addition, photoresist may be coated on the first metal layer, and exposure and developing processes may be performed using an exposure mask to form a photoresist pattern (not shown) having a predetermined shape. The first metal layer exposed outside the photoresist pattern may be etched so that a gate line (not shown) extending in one direction can be formed on the substrate 101. Simultaneously, a gate electrode 105 may be formed in the switching region TrA of each of the pixel regions P and connected to the gate line.

FIG. 2A exemplarily illustrates that the gate line and the gate electrode 105 forms a single layer structure.

Figure 2B:
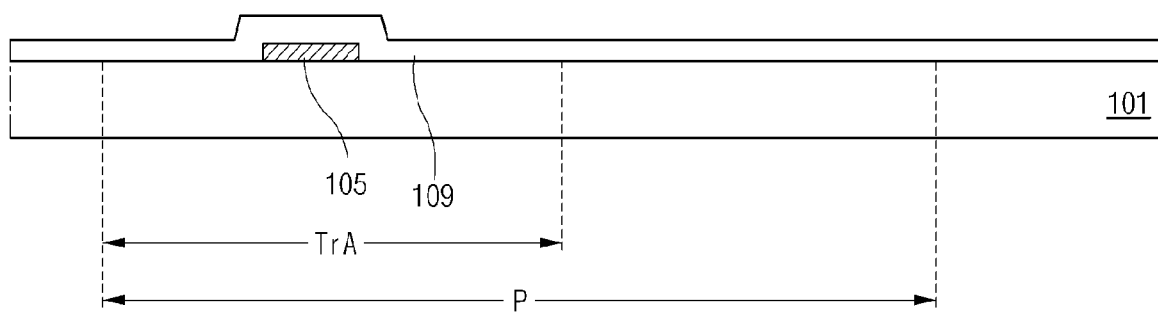

Next, as shown in FIG. 2B, an inorganic insulating material, for example, silicon oxide ($SiO_2$) or silicon nitride ($SiN_x$), may be deposited on the gate line and the gate electrode 105 so that a gate insulating layer 109 may be formed on the entire surface of the substrate 101.

Figure 2C:
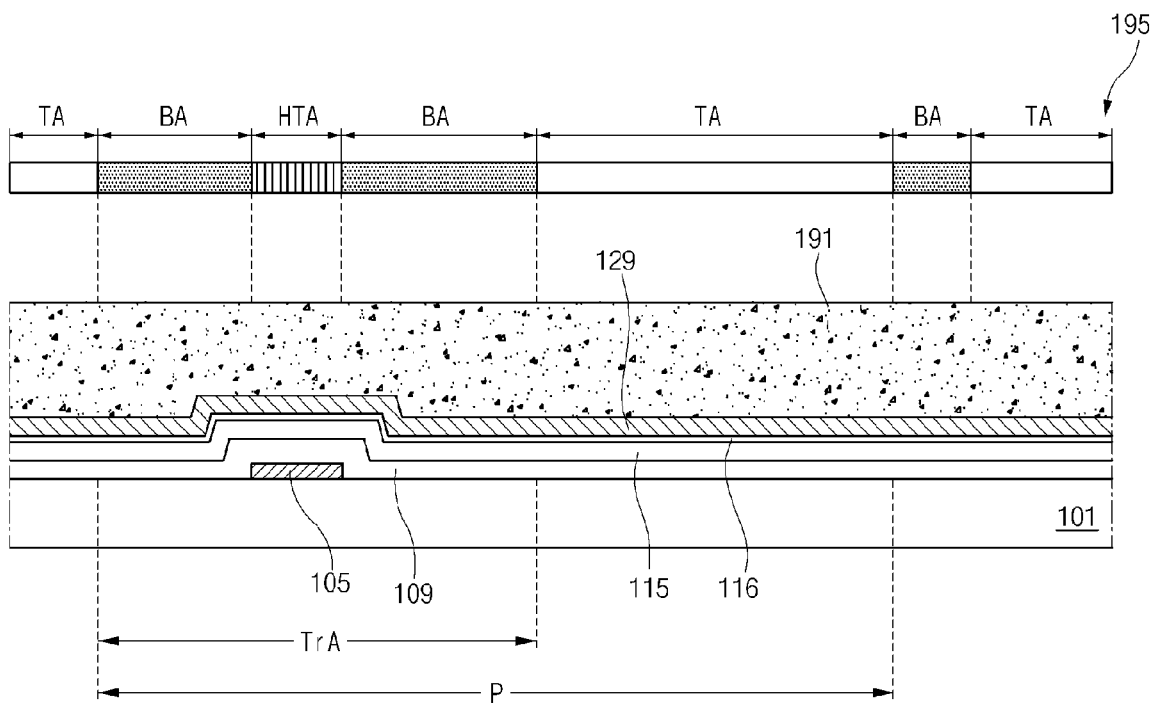

Next, as shown in FIG. 2C, pure amorphous silicon (a-Si) and doped a-Si may be sequentially deposited on the gate insulating layer 109, thereby forming a pure a-Si layer 115 and a doped a-Si layer 116.

Subsequently, a metal material having low-resistance characteristics, for example, at least one material of aluminum, an aluminum alloy, molybdenum, and molybdenum titanium, may be deposited on the doped a-Si layer 116, thereby forming a second metal layer 129 having a single or multilayered layer structure.

Thereafter, photoresist may be coated on the second metal layer 129 to form a photoresist layer 191. An exposure mask 195 including a light blocking region BA, a transmissive region TA, and a semi-transmissive region HTA having a smaller light transmittance than the transmissive region TA may be disposed on the second photoresist layer 191.

In this case, the exposure mask 195 including a data line (refer to 130 in FIG. 2E) may be located so that the light blocking region BA may correspond to a region where source and drain electrodes (refer to 135 and 137 of FIG. 2G) will be formed, a region of the switching region TrA where the source and drain electrodes 135 and 137 are spaced apart from each other may correspond to the semi-transmissive region HTA, and a portion where the data line 130 and the source and drain electrodes 135 and 137 are not formed may correspond to the transmissive region TA.

Figure 2D:
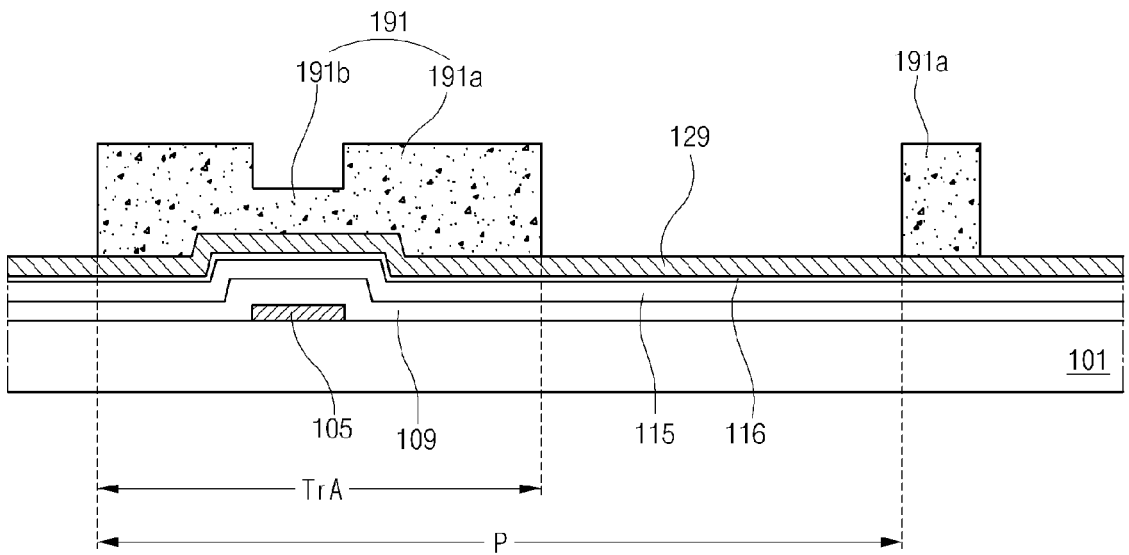

Next, referring to FIG. 2D, as described above, the photoresist layer (refer to 191 in FIG. 2C) may be exposed through the exposure mask (refer to 195 in FIG. 2C) disposed in a position corresponding to the photoresist layer 191, and then developed. Thus, a first photoresist pattern 191*a* having a first thickness may be formed on the second metal layer 129 to correspond to a portion where the data line 130 and the source and drain electrodes 135 and 137 will be formed. Simultaneously, a second photoresist pattern 191*b* having a second thickness smaller than the first thickness may be formed on the second metal layer 129 to correspond to the gate electrode 105 and the region where the source and drain electrodes 135 and 137 are spaced apart from each other. The photoresist layer 191 may be removed from the remaining portion of the second metal layer 129 to expose the second metal layer 129. A one-time exposure process performed using the exposure mask 195 including the semi-transmissive region (HTA of FIG. 2D) having a plurality of slits to form the first and second photoresist patterns 191*a* and 191*b* having different thicknesses may be referred to as a diffraction exposure process.

Meanwhile, in addition to the above-described diffraction exposure process, a method of forming the photoresist patterns 191*a* and 191*b* having the first and second thicknesses may include a halftone exposure process using an exposure mask including the semi-transmissive region HTA having a plurality of coating layers for controlling the amount of transmitted light instead of the slits. Even if the halftone exposure process is performed, the same results as described above may be obtained.

The first embodiment of the present invention pertains to an example in which positive-type photoresist is used so that a portion of the photoresist layer (refer to 191 in FIG. 2C) corresponding to the transmissive region (refer to TA in FIG. 2C) of the exposure mask (refer to 195 in FIG. 2C) can be removed during the developing process. However, negative-type photoresist having opposite characteristics may be naturally used so that a transmissive region can remain after a developing process. In this case, the same results as described above may be obtained by performing an exposure process using an exposure mask in which positions of a transmissive region and a light blocking region are exchanged.

Figure 2E:
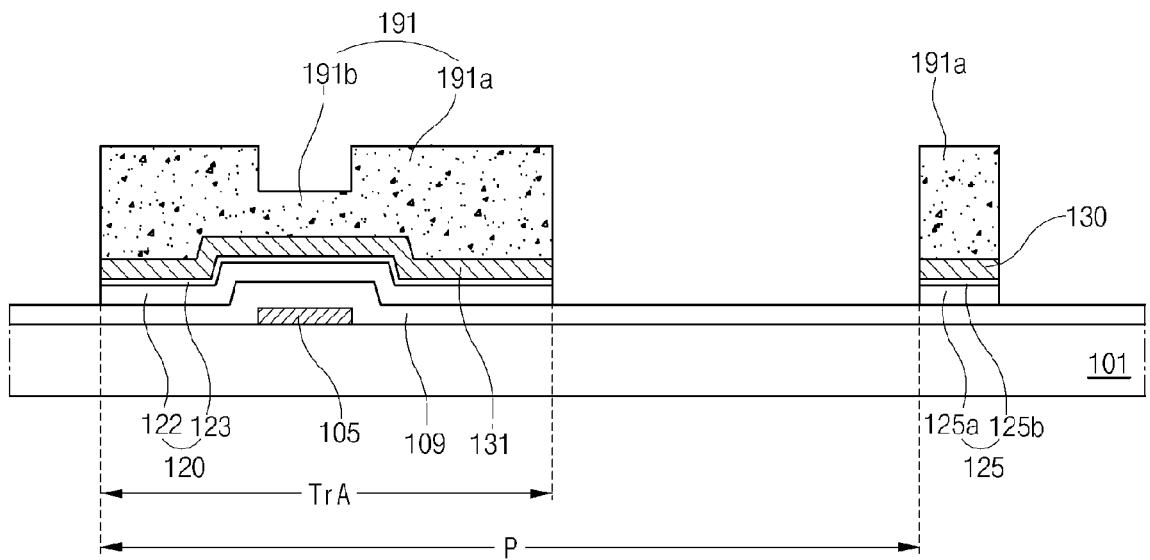

Referring to FIG. 2E, an etching process may be performed on the substrate 101 including the first and second photoresist patterns 191*a* and 191*b* having the first and second thicknesses so that the second metal layer (refer to 129 in FIG. 2D) exposed outside the first and second photoresist patterns 191*a* and 191*b* and the doped a-Si layer (refer to 116 in FIG. 2D) and the pure a-Si layer (refer to 115 in FIG. 2D) disposed thereunder, can be sequentially removed to expose the gate insulating layer 109.

In this case, the second metal layer 129, the doped a-Si layer 116, and the pure a-Si layer 115 disposed under the first and second photoresist patterns 191*a* and 191*b* may not be etched but remain intact using the first and second photoresist patterns 191*a* and 191*b* as an etching mask.

In this case, the second metal layer 129 remaining under the first and second photoresist patterns 191*a* and 191*b* may form a source/drain pattern 131 and the data line 130 connected to each other, the doped a-Si layer 116 may form a connected doped a-Si pattern 123, and the pure a-Si layer 115 may form an active layer 122. In this case, a doped a-Si pattern 125*b* and a pure a-Si pattern 125*a* may also remain under the data line 130 due to process characteristics.

Figure 2F:
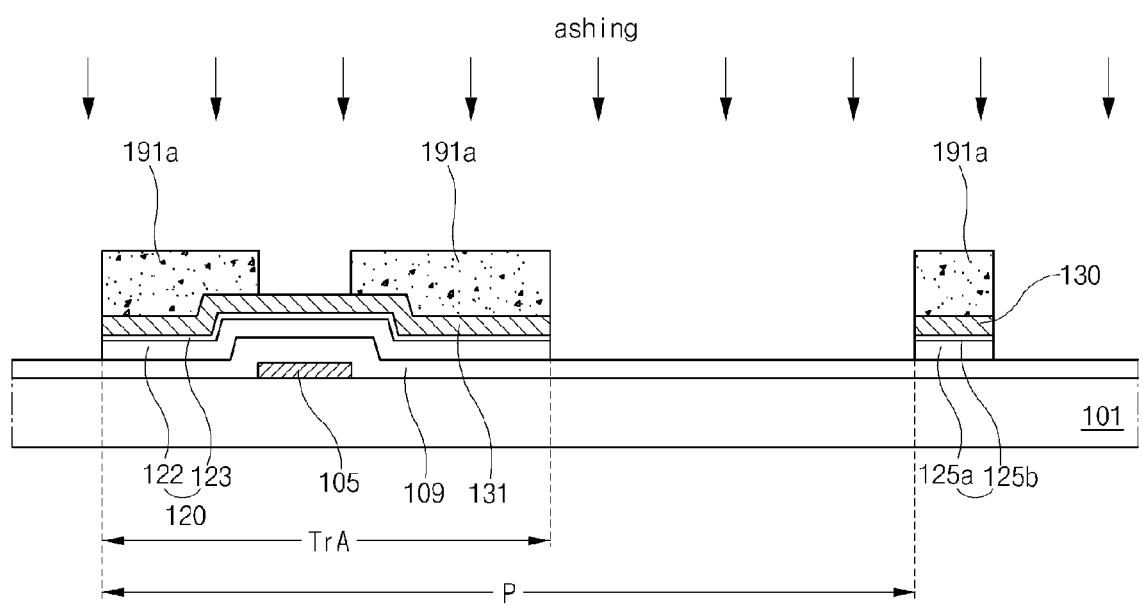

Referring to FIG. 2F, an ashing process may be performed on the first photoresist pattern 191*a* and the second photoresist pattern (not shown) to remove the second photoresist pattern (not shown) having the second thickness. In this case, the first photoresist pattern 191*a* formed to a larger thickness than the second photoresist pattern may thin out due to etching and still remain on the source/drain pattern 131 and the data line 130.

Figure 2G:
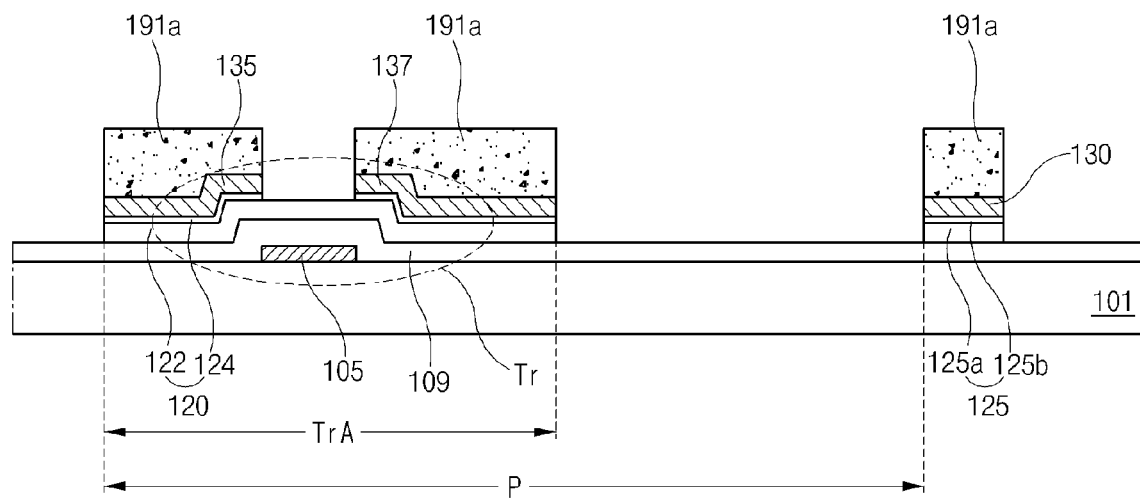
Figure 2H:
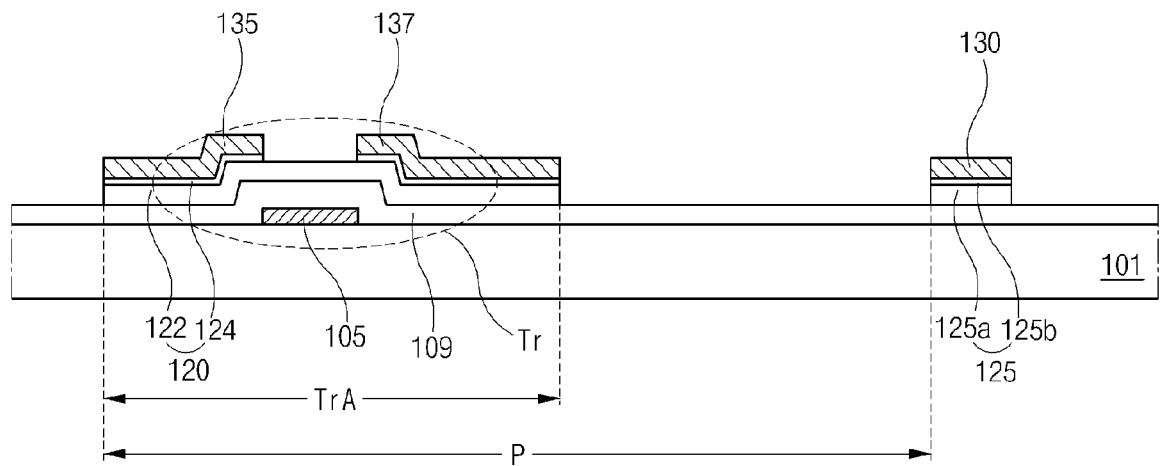

Referring to FIG. 2G, the source/drain pattern (refer to 131 in FIG. 2F) exposed between the first photoresist patterns 191*a* formed in the switching region TrA may be etched using the remaining first photoresist pattern 191*a* as an etching mask. Thereafter, the doped a-Si pattern (refer to 123 in FIG. 2F) disposed under the source/drain pattern 131 may be removed using a dry etching process, thereby exposing the pure a-Si active layer 122 disposed under the doped a-Si pattern 123.

In this case, the remaining source/drain pattern 131, which is not etched due to the first photoresist pattern 191*a* in the switching region TrA, may form source and drain electrodes 135 and 137 spaced apart from each other.

Furthermore, the doped a-Si patterns 123 disposed apart from each other under the source and drain electrodes 135 and 137 may form an ohmic contact layer 124, which may constitute a semiconductor layer 120 along with the pure a-Si active layer 122 disposed under the ohmic contact layer 124.

Meanwhile, the gate electrode 105, the gate insulating layer 109, the semiconductor layer 120 including the a-Si active layer 122 and doped a-Si ohmic contact layer 124 having portions spaced apart from each other, and the separately-formed source and drain electrodes 135 and 137 may be sequentially stacked on the substrate 101 in the switching region TrA and constitute a TFT Tr.

Thereafter, referring to FIG. 2F, the first photoresist pattern (refer to 191*a* in FIG. 2G) remaining on the data line 130 and the source and drain electrodes 135 and 137 may be removed using a stripping process to expose the data line 130 and the source and drain electrodes 135 and 137.

Figure 2I:
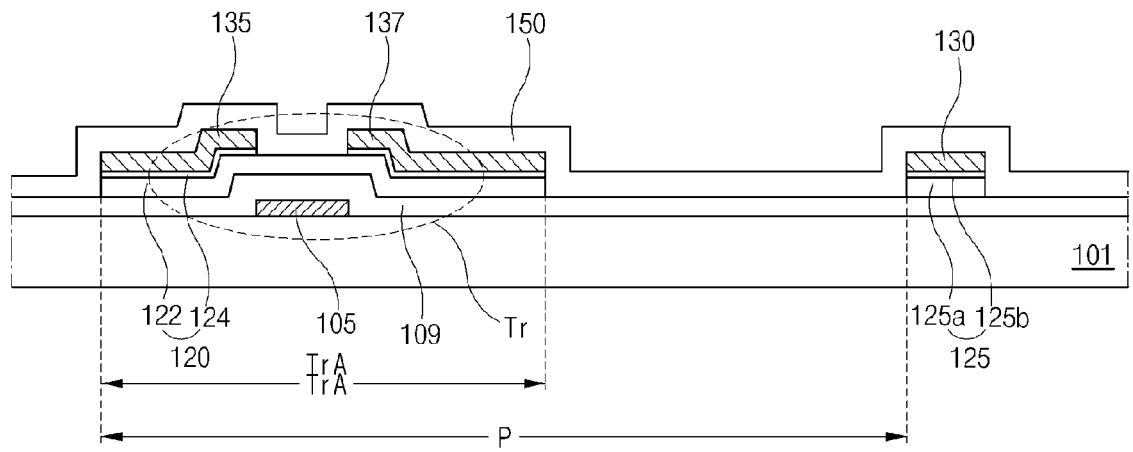
Figure 2J:
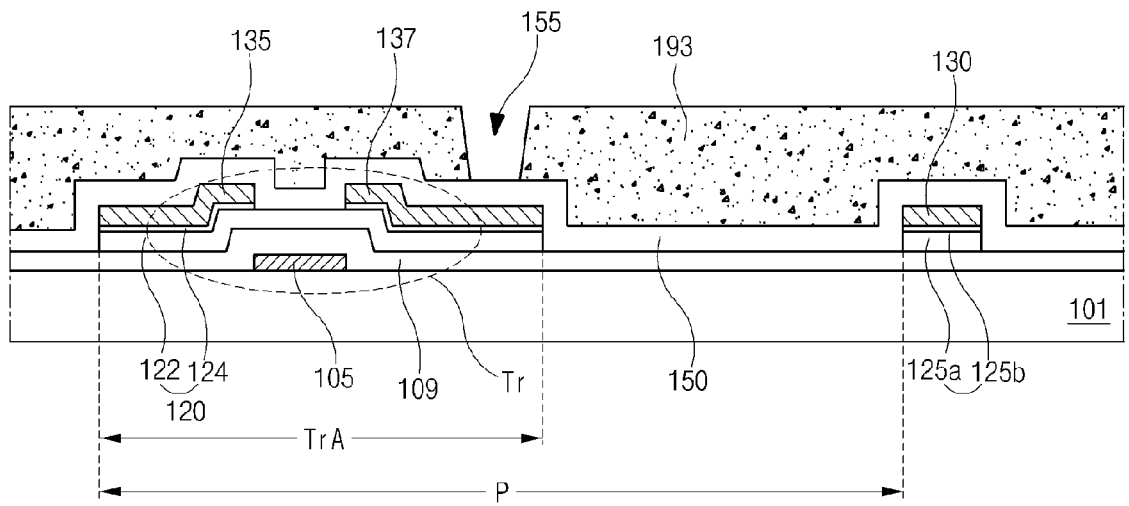
Figure 2K:
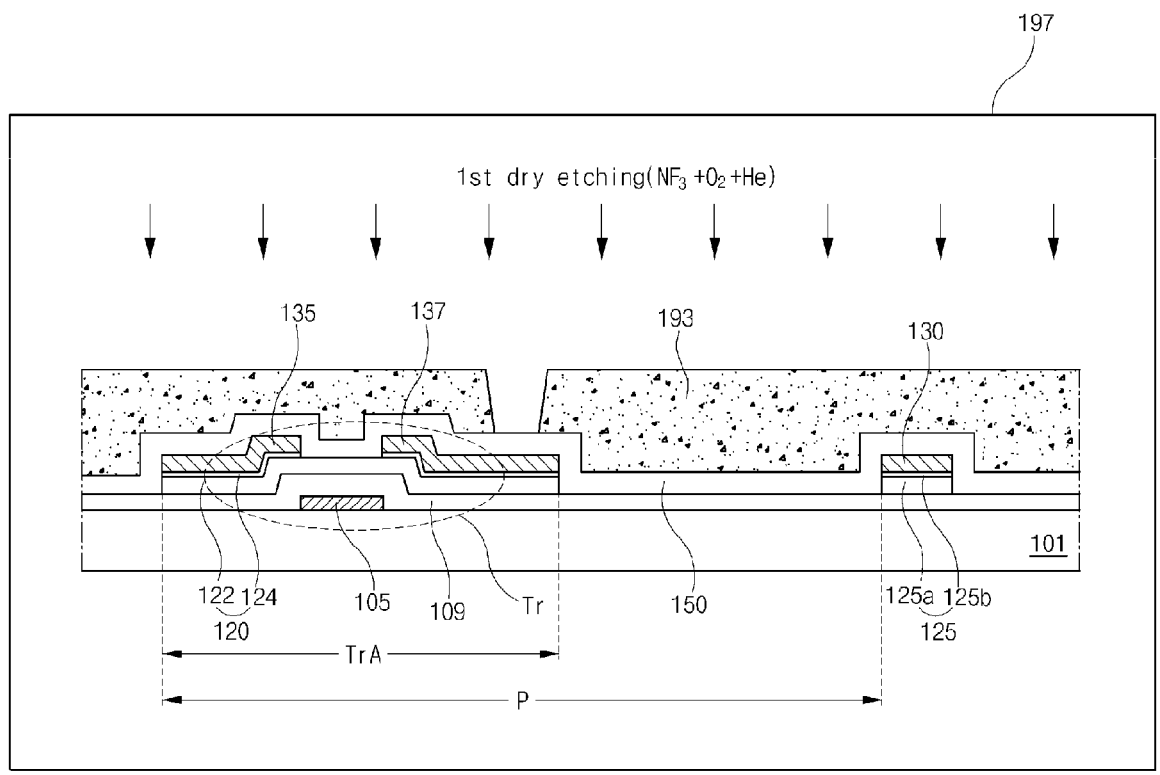
Figure 2L:
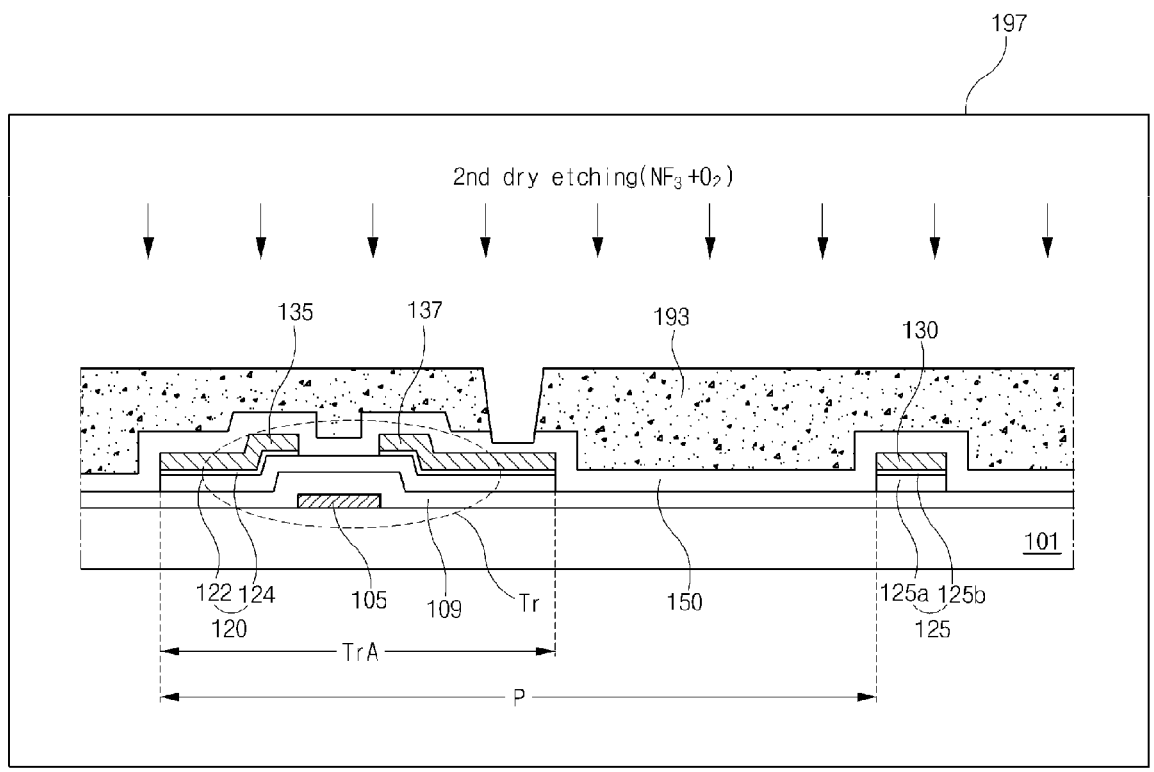
Figure 2M:
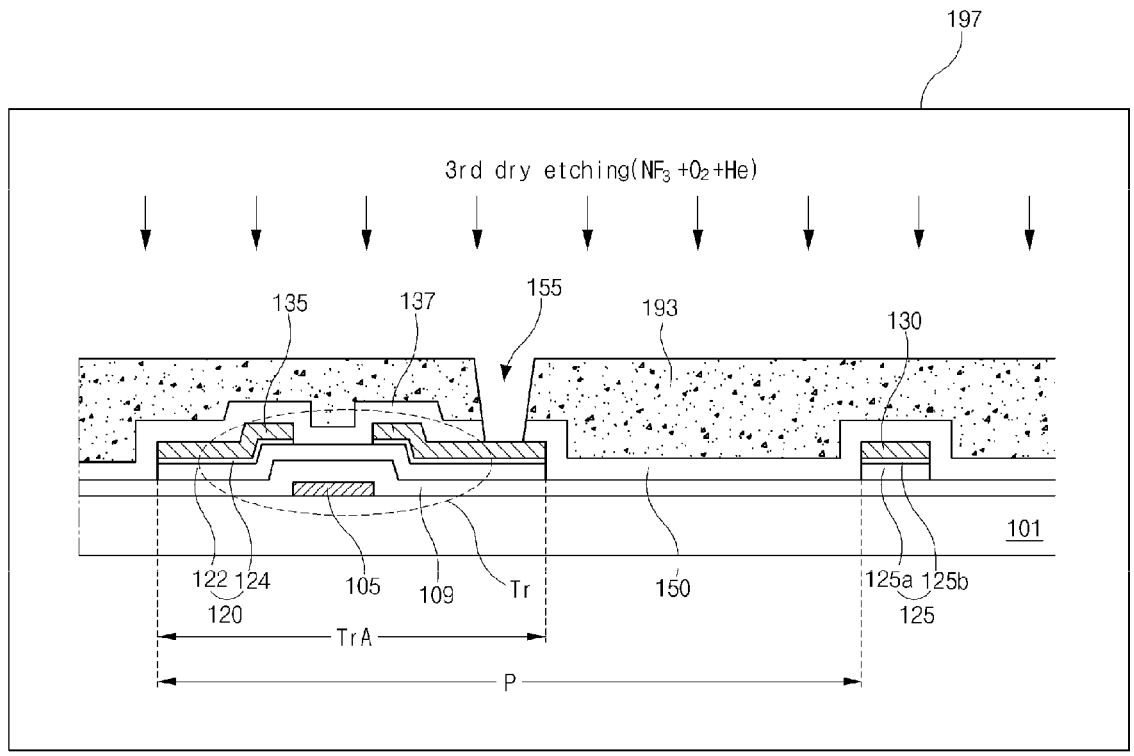

Referring to FIG. 2I, an inorganic insulating material, for example, silicon nitride ($SiN_x$), may be deposited on the data line 130 and the source and drain electrodes 135 and 137, thereby forming a protection layer 150 on the entire surface of the substrate 101.

Referring to FIG. 2I, photoresist may be coated on the protection layer 150 to form a photoresist layer (not shown), and an exposure process may be performed on the photoresist layer using an exposure mask (not shown) having a transmissive region (not shown) and a light blocking region (not shown). Thereafter, a developing process may be performed on the exposed photoresist layer so that a third photoresist pattern 193 can be formed in a position corresponding to the drain electrode 137 of the TFT Tr to expose the protection layer 150.

Referring to FIGS. 2J, 2K, 2L, and 2M, the substrate 101 having the third photoresist pattern 193 formed on the protection layer 150 may be loaded into a chamber 197 of a dry etching system (not shown) configured to dry etch the protection layer 150.

Thereafter, the inside of the chamber 197 may be adjusted to a vacuum atmosphere, for example, a vacuum atmosphere having a pressure of about 350 mTorr to about 450 mTorr. Afterwards, while applying power of about 1700 W to 1900 W, a dry etching process using plasma may be performed by alternately supplying a first gas mixture containing nitrogen trifluoride ($NF_3$), oxygen ($O_2$), and helium (He), and a second gas mixture containing nitrogen trifluoride and oxygen.

Hereinafter, on analysis of the flow rate of each element per unit time in the first gas mixture supplied into the chamber 197 during the dry etching process, the nondimensional ratio of the flow rate of helium, the flow rate of nitrogen trifluoride, and the flow rate of oxygen may range from 1:1.15:3.6 to 1:1.2:4.5; the nondimensional ratio of the flow rates of helium, nitrogen trifluoride, and oxygen is defined as a ratio of the flow rate of each element per unit time (expressed in sccm) to the flow rate of helium per unit time (expressed in sccm).

In the second gas mixture supplied during a second dry etching process, the ratio of the flow rate of nitrogen fluoride per unit time to the flow rate of oxygen per unit time may range from 1:10 to about 1:10.

One feature of the first embodiment of the present invention may be to perform a dry etching process by alternating the first gas mixture and the second gas mixture once. Specifically, a first dry etching process may be performed in an atmosphere of the first gas mixture, a second dry etching process may be performed after changing an inner gas atmosphere of the chamber 197 into an atmosphere of the second gas mixture, and a third dry etching process may be performed after changing the inner gas atmosphere of the chamber 197 into the atmosphere of the first gas mixture.

When the dry etching of the protection layer 150 according to the first embodiment of the present invention includes performing the first through third dry etching processes on the protection layer 150 while alternately supplying the first and second gas mixtures, a reduction in dry etch rate may be prevented with the accumulation of the dry etching processes.

When the protection layer 150 formed of silicon nitride ($SiN_x$) is dry etched using sulfur hexafluoride ($SF_6$) gas, which is used in a conventional method of fabricating an array substrate, and a gas mixture containing oxygen and helium, even if a dry etched amount is accumulated within the chamber 197, a reduction in dry etch rate does not occur.

When nitrogen trifluoride ($NF_3$) gas having about ⅔ the GWP of sulfur hexafluoride and a self-decomposition rate of 97% or higher is used as a reactive gas used for dry etching the protection layer 150 formed of silicon nitride instead of sulfur hexafluoride having a relatively high GWP among greenhouse gases causing global warming, nitrogen contained in nitrogen trifluoride $NF_3$ may react with a carbon (C) element, which is an organic material contained in the third photoresist pattern 193 to form a C—N compound (Cx+Nx). As time elapses, the concentration of the C—N compound (Cx+Nx) in the chamber 197 may increase, and the amount of the C—N compound (Cx+Nx) adsorbed on the surface of the protection layer 150 formed of silicon nitride per unit time may increase, thereby reducing a dry etch rate.

Accordingly, in the method of fabricating the array substrate 101 according to the first embodiment of the present invention, which uses a gas mixture containing nitrogen trifluoride instead of sulfur hexafluoride as a reactive gas used for the chamber 197, a dry etching process may be performed by alternately injecting a first gas mixture and a second gas mixture so that a dry etch rate can be prevented from dropping over time. The first gas mixture may contain helium (He) gas and contain nitrogen trifluoride ($NF_3$) and oxygen ($O_2$) in a flow-rate ratio of 1.15:3.6 to 1.2:4.5 assuming that the flow rate of helium is 1. The second gas mixture may contain nitrogen trifluoride and oxygen without helium and contain nitrogen trifluoride and oxygen in a flow-rate ratio of 1:10 to 1:11 per unit time.

In this case, during the first and third dry etching processes using the first gas mixture, helium may be injected into the chamber 197 at a flow rate of about 145 standard cubic centimeter per minute (sccm) to about 155 sccm, and oxygen ($O_2$) may be injected into the chamber 197 at a flow rate of about 522 sccm to about 698 sccm. Also, during the second dry etching process using the second gas mixture, nitrogen trifluoride may be injected into the chamber 197 at a flow rate of about 47 sccm to about 59 sccm, and oxygen may be injected into the chamber 197 at a flow rate of about 522 sccm to about 698 sccm.

In addition, each of the first and third dry etching processes using the first gas mixture may be performed about two to three times as long as the second dry etching time using the second gas mixture. In this case, the second etching process may be performed for about 15 seconds to about 20 seconds.

Table 1 shows the measurements of the remaining thickness of the protection layer 150 formed of silicon nitride ($SiN_x$) in the first embodiment of the present invention in which first, second, and third dry etching processes were performed using first and second gas mixtures such that each of the first and third dry etching processes was performed for about two to three times as long as the second dry etching process, in a first comparative example in which a dry etching process was performed using only the first gas mixture, and in a second comparative example in which first, second, and third dry etching processes were performed by alternately injecting the first and second gas mixtures such that each of the first and third dry etching processes was performed for less than about twice as long as the second dry etching process. In this case, the thickness of the protection layer 150 measured before dry etching, a dry-etched amount, etch time, and etch rate per unit time are also shown in Table 1.

TABLE 1

| Division | Thickness of protection layer before etching | Remaining thickness of protection layer after etching | Etched amount | Etch time | Etch rate per unit time |
|---|---|---|---|---|---|
| Embodiment | 5710 Å | absence | 5710 Å | 115 sec | 49 Å/sec |
| Comparative example 1 | 5530 Å | 3730 Å | 1800 Å | 95 sec | 19 Å/sec |
| Comparative example 2 | 5670 Å | 2860 Å | 2810 Å | 105 sec | 27 Å/sec |

Referring to Table 1, it can be seen that there was no remaining protection layer 150 after the dry etching process in the first embodiment of the present invention. However, when the dry etching process was performed using only the first gas mixture without performing the dry etching process using the second gas mixture, a by-product formed of a C—N compound (Cx+Nx) generated by a reaction of nitrogen with carbon, which is an element forming a photoresist pattern, was adsorbed on the surface of the protection layer 150 to hinder the dry etching process. As a result, the etched amount was markedly reduced so that the protection layer 150 was left to a thickness equal to or more than ½ the original thickness thereof.

Similarly, in the second comparative example in which the second dry etching process using the second gas mixture was not sufficiently performed, although a larger amount of protection layer 150 was etched than in the first comparative example in which the dry etching process was performed using only the first gas mixture, the protection layer 150 was still left to a thickness of about 2860 Å.

Therefore, it can be seen that the patterning efficiency of the protection layer 150 formed of silicon nitride was excellent in the method of fabricating the array substrate 101 according to the first embodiment of the present invention in which a dry etching process using the He-free second gas mixture using nitrogen trifluoride as the reactive gas and containing nitrogen trifluoride and oxygen in a flow-rate ratio of 1 to 10 or more, was performed for an appropriate amount of time between dry etching processes using the first gas mixture containing nitrogen trifluoride, oxygen, and helium.

Figure 2N:
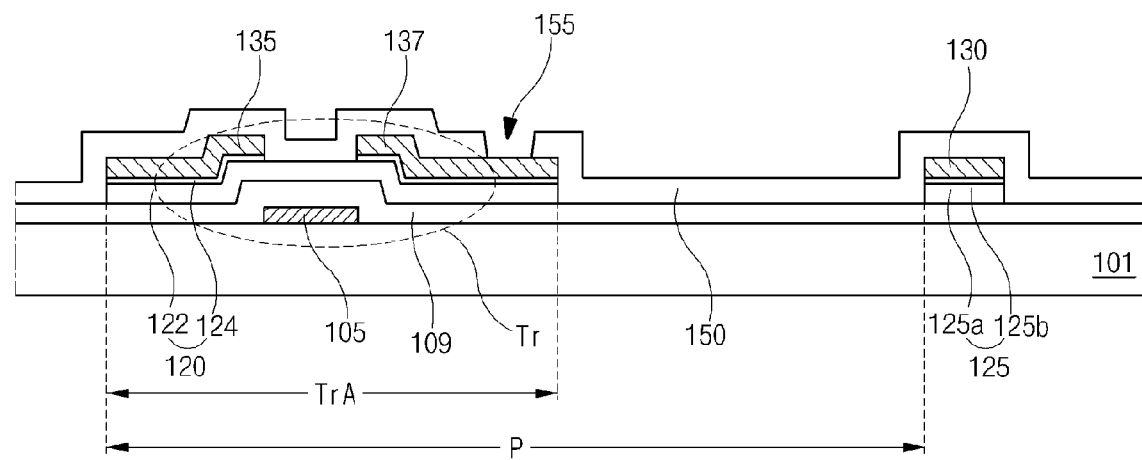

Meanwhile, after forming a drain contact hole 155 exposing the drain electrode 137 of the TFT Tr in the protection layer 150 using the above-described process, as shown in FIG. 2N, the third photoresist pattern 193 remaining on the protection layer 150 may be removed using a stripping process.

Figure 2O:
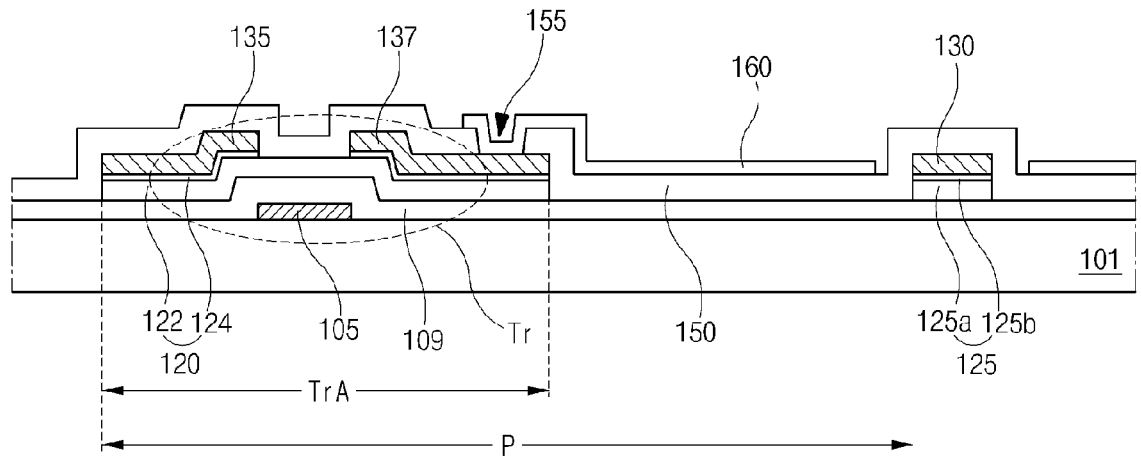

Next, as shown in FIG. 2O, a transparent conductive material, such as indium tin oxide (ITO) or indium zinc oxide (IZO), may be deposited on the protection layer 150 having the drain contact hole 155, and patterned using a mask process. Thus, a pixel electrode 160 contacting the drain electrode 137 through the drain contact hole 155 may be formed in each of the pixel electrodes P, thereby forming the array substrate 101.

Although FIG. 2O illustrates that only the pixel electrode 160 is formed in each of the pixel regions P on the completed array substrate 101, a common electrode (not shown) may be further formed on the protection layer 150 in each of the pixel electrodes P. In this case, a common line (not shown) may be further formed parallel to and apart from the gate line (not shown) at the same layer as the gate line. Also, a common contact hole (not shown) exposing the common electrode may be further formed in the protection layer 150 and the gate insulating layer 109, and the common electrode may be in contact with the common line through the common contact hole.

In this case, in an array substrate (not shown) according to a modified example of the present invention, the common contact hole may be formed during the formation of the drain contact hole 155 using the same method as described above.

In another modified example of the present invention, a common electrode (not shown) having a plurality of bar-shaped openings (not shown) may be formed in each of the pixel electrodes P on the array substrate 101 by interposing an insulating layer (not shown) between the pixel electrode 160 and the common electrode.

In methods of fabricating an array substrate according to the first embodiment and modified examples of the present invention, the protection layer 150 formed of silicon nitride may be dry etched using nitrogen trifluoride instead of sulfur hexafluoride acting as a greenhouse gas. Since nitrogen trifluoride has a smaller influence on global warming than sulfur hexafluoride and a high self-decomposition rate of about 97% due to plasma generated during the dry etching process, the use of sulfur hexafluoride may be inhibited, thereby reducing the emission of the greenhouse gas facilitating global warming.

Furthermore, since the method of fabricating the array substrate 101 according to the first embodiment of the present invention reduces the use of greenhouse gases, it is unnecessary to additionally install a thermal decomposition apparatus for reprocessing sulfur hexafluoride acting as a greenhouse gas into gas having a low GWP, and it is also unnecessary to purchase greenhouse development rights (GDR) for allowing the use of greenhouse gases, which will come into effect in 2015. Thus, a rise in the fabrication cost of products may be suppressed.

In the method of fabricating the array substrate 101 according to the first embodiment of the present invention, a dry etching process may be performed using nitrogen trifluoride gas as a reactive gas at about the same etch rate as sulfur hexafluoride gas. Also, factors in causing a drop in etch rate with an increase in accumulated dry etched amount may be removed, thereby improving productivity per unit time.

Embodiment 2

Meanwhile, formation of low-resistance lines has lately become problematic due to the scaling-up of display devices, that is, formation of 30-inch-plus large-area display devices.

Since 30-inch-plus large-area display devices have longer lines, signal delays may occur.

To minimize the above-described problems, lines may be formed of a metal material having a relatively low resistance per unit area. Copper (Cu) or a copper alloy, which has a lower resistance per unit area and is cheaper than aluminum (Al) or an aluminum alloy (e.g., aluminum-neodymium (AlNd)) used for lines of a typical array substrate, has become an alternative to aluminum or an aluminum alloy.

A second embodiment of the present invention pertains to a method of fabricating an array substrate in which when a line is formed using copper or a copper alloy having a low resistance, damage to the line formed of copper or a copper alloy or an electrode may be prevented during the dry etching of a protection layer 150 using a reactive gas containing nitrogen trifluoride.

In this case, the second embodiment is the same as the first embodiment except that a gate line, a gate electrode, a data line, and source and drain electrodes include a single layer formed of copper or a copper alloy, or include a double structure having a first layer formed of a highly adhesive metal to improve adhesion to a substrate, and a second layer formed of copper or a copper alloy on the first layer, and a protection layer is formed using a different dry etching process. Thus, only the process of dry etching the protection layer, which is different than in the first embodiment, will be described in detail with reference to FIGS. 3 and 4.

Figure 3:
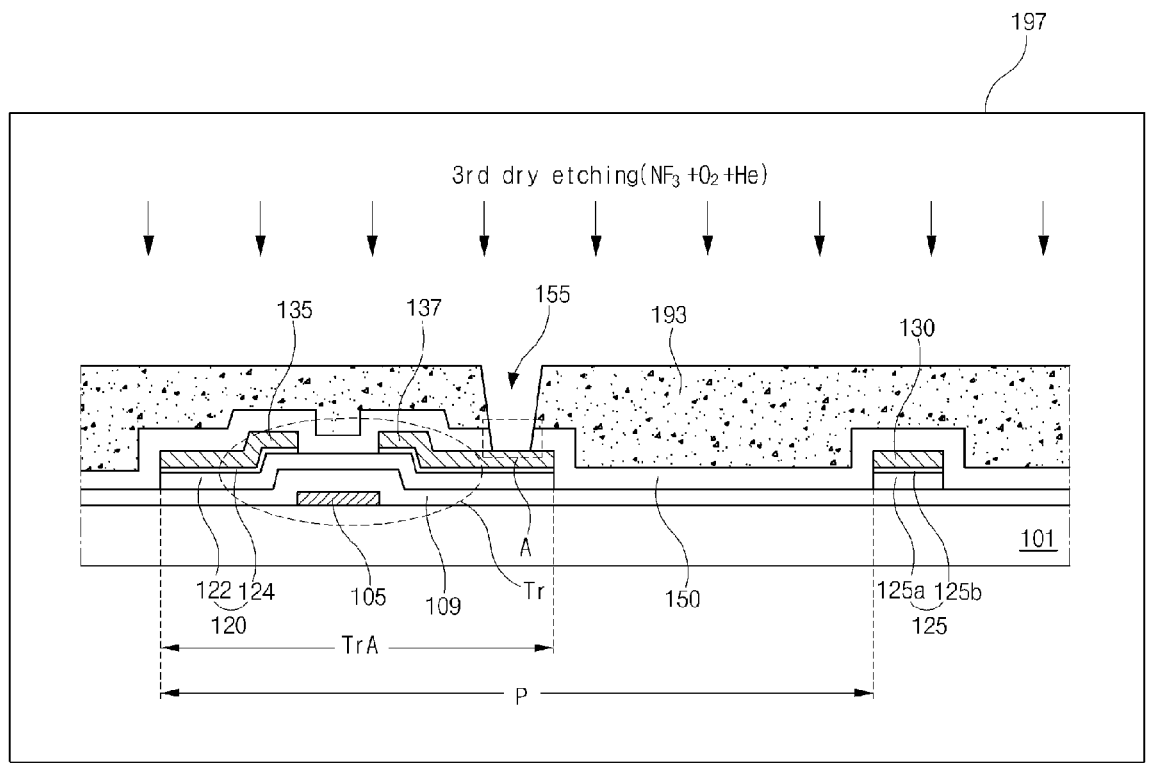
FIG. 3 is a cross-sectional view illustrating a process of forming a contact hole in a protection layer in a method of fabricating an array substrate according to a second embodiment of the present invention.
Figure 4:
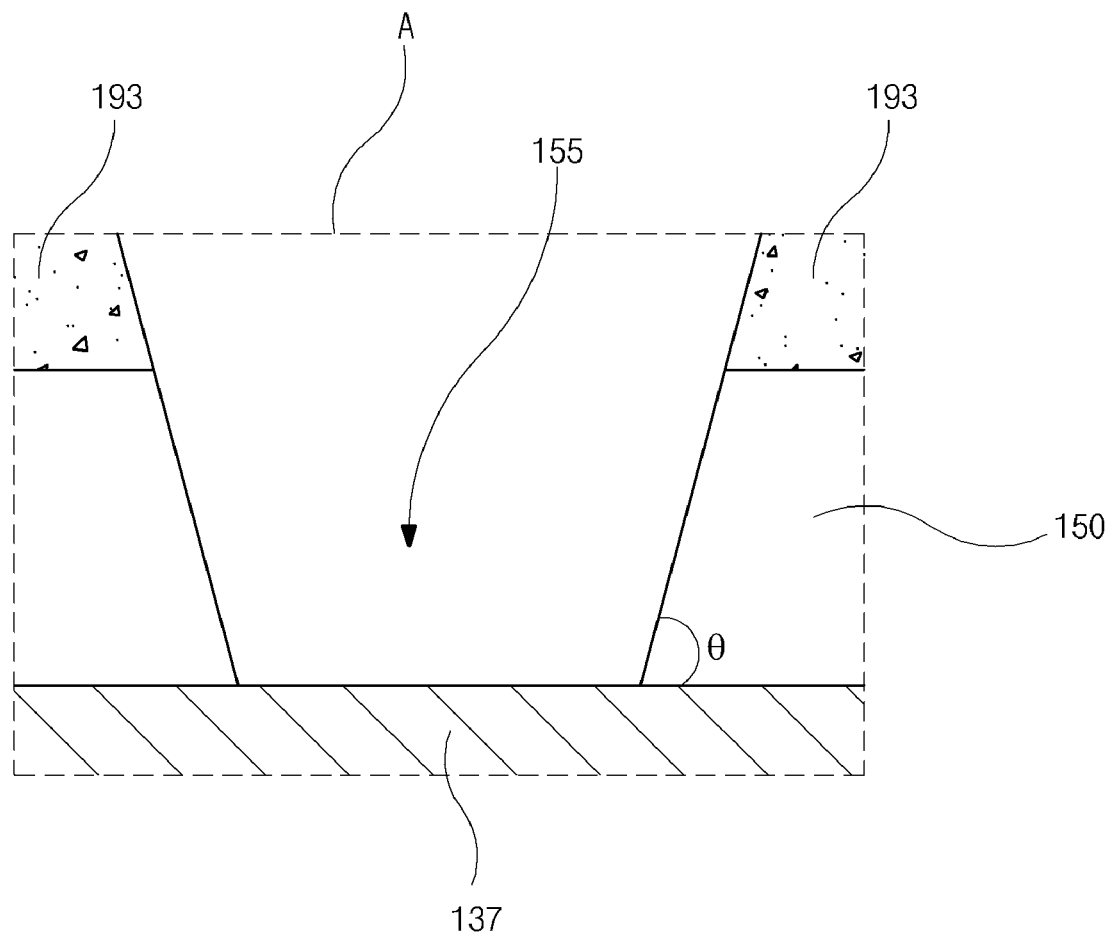
FIG. 4 is an enlarged view of region A of FIG. 3.

FIG. 3 is a cross-sectional view illustrating a process of forming a contact hole in a protection layer in a method of fabricating an array substrate according to a second embodiment of the present invention, and FIG. 4 is an enlarged view of region A of FIG. 3. For brevity, the same reference numerals are used to denote the same elements as in the first embodiment.

To begin with, a photoresist layer (not shown) may be formed by coating photoresist on a protection layer 150 formed of silicon nitride on a substrate 101 on which the protection layer 150 is formed on a data line 130 formed of copper or a copper alloy and source and drain electrodes 135 and 137. An exposure process may be performed on the photoresist layer using an exposure mask having a transmissive region and a light blocking region, and a developing process may be performed on the exposed photoresist layer so that a photoresist pattern 193 exposing the protection layer 150 can be formed to correspond to a drain electrode 137 of a TFT Tr.

Next, the substrate 101 on which the photoresist pattern 193 is formed on the protection layer 150 may be loaded into a chamber 197 for a dry etching apparatus configured to dry etch the protection layer 150.

Thereafter, the inside of the chamber 197 may be adjusted to a vacuum atmosphere having a pressure of, for example, about 350 mTorr to about 450 mTorr. While applying power of about 1700 W to about 1900 W, a dry etching process using plasma may be performed by alternately supplying a first gas mixture containing nitrogen trifluoride, oxygen, and helium, and a second gas mixture containing nitrogen trifluoride and oxygen.

In this case, on analysis of the flow rate of each element per unit time in the first gas mixture supplied into the chamber 197 during the dry etching process, the nondimensional ratio of the flow rate of helium, the flow rate of nitrogen trifluoride, and the flow rate of oxygen may range from 1:1.15:2.875 to 1:1.2:3.6; the nondimensional ratio of the flow rates of helium, nitrogen trifluoride, and oxygen is defined as a ratio of the flow rate of each element per unit time (expressed in sccm) to the flow rate of helium per unit time (expressed in sccm).

The second embodiment differs from the first embodiment in that the flow rate of oxygen is relatively small.

According to the first embodiment in which a line is formed of aluminum, an aluminum alloy (e.g., AlNd), molybdenum (Mo), or a molybdenum alloy (e.g., molybdenum titanium (MoTi)), in the first gas mixture used in the dry etching process, the ratio of the flow rate of nitrogen trifluoride to the flow rate of oxygen, except for helium, may range from 1.15:3.6 to 1.2:4.5, which is more than 1:3.

However, according to the second embodiment in which a line or electrode is formed of copper or a copper alloy, in the first gas mixture used in the dry etching of the protection layer 150, the nondimensional ratio of the flow rate of nitrogen trifluoride to the flow rate of oxygen may range from 1.15:2.875 to 1.2:3.6, which is substantially less than or equal to 1:3; the nondimensional ratio of the flow rates of nitrogen trifluoride and oxygen is defined as a ratio of the flow rate of each element per unit time (expressed in sccm) to the flow rate of helium per unit time (expressed in sccm).

When the line or electrode is formed of copper or a copper alloy, the ratio of the flow rate of nitrogen trifluoride to the flow rate of oxygen contained in the first gas mixture may be adjusted to 1:3 or less during the dry etching of the protection layer 150 to prevent damage to the surface of the line or electrode formed of copper or a copper alloy.

Specifically, when a drain contact hole 155 exposing the drain electrode 137, which is an example of the line or electrode formed of copper or a copper alloy, is formed in the protection layer 150, the protection layer 150 exposed between the photoresist patterns 193 may be dry etched due to the first gas mixture to expose the surface of the drain electrode 137. In this case, when the flow rate of oxygen is high, the surface of the drain electrode 137 may be oxidized to form a copper oxide ($CuO_X$) layer. The surface of the drain electrode 137 may be damaged by the copper oxide layer, thereby degrading contact characteristics between the drain electrode 137 and a pixel electrode (not shown) to be formed sequentially.

Accordingly, to prevent the above-described phenomena, in the first gas mixture containing helium, nitrogen trifluoride, and oxygen used during the dry etching of the protection layer 150 formed of silicon nitride according to the second embodiment of the present invention, the ratio of the flow rate of nitrogen trifluoride to the flow rate of oxygen may be adjusted to 1:3 or less, more specifically, within a range of 1:2.5 to 1:3.

When the first gas mixture is supplied into the chamber 197, helium, nitrogen trifluoride, and oxygen may be substantially supplied into the chamber 197 at a flow rate of about 145 sccm to about 155 sccm, a flow rate of about 166 sccm to about 186 sccm, and a flow rate of about 417 sccm to about 558 sccm, respectively.

In a second dry etching process, since the ratio of the flow rate of nitrogen trifluoride to the flow rate of oxygen ranges from 1:10 to 1:11, it seems that oxygen is supplied at a high flow rate. However, the flow rate of oxygen supplied into the chamber 197 during the second dry etching process is maintained at the same level as the flow rate of oxygen supplied into the chamber 197 during each of first and third dry etching processes, and only the flow rate of nitrogen trifluoride is reduced. Thus, the amount of oxygen contained in the chamber 197 is maintained at a substantially constant level, and time taken to perform the second dry etching process is about ⅓ to ½ the time taken to perform each of the first and second dry etching processes. Also, the second dry etching process is not problematic because the line or electrode formed of copper or a copper alloy is not substantially exposed.

Meanwhile, in the modified example of the second embodiment, the line or electrode formed of copper or a copper alloy may not be substantially exposed during the first dry etching process of the protection layer 150 formed of silicon nitride. Particularly, as described in the first embodiment, the first dry etching process may be performed by adjusting the nondimensional ratio of the flow rate of nitrogen trifluoride to the flow rate of oxygen to 1.15:3.6 to 1.2:4.5; the nondimensional ratio of the flow rates of nitrogen trifluoride and oxygen is defined as a ratio of the flow rate of each element per unit time (expressed in sccm) to the flow rate of helium per unit time (expressed in sccm).

Meanwhile, when the protection layer 150 is removed by etching according to the second embodiment of the present invention, a surface of the line or electrode formed of copper or a copper alloy, which is exposed by forming the contact hole 155, may be prevented from being damaged by further reducing the flow rate of oxygen contained in the first gas mixture supplied into the chamber 197, particularly, during the third dry etching process. However, the ratio of the flow rate of nitrogen trifluoride to the flow rate of oxygen may not be less than 1:2.5 such that an angle θ formed by an inner side surface of the contact hole 155 with the surface of the electrode or line is 75°, more specifically, ranges from 45° to 75°.

When the angle θ formed by the inner side surface of the contact hole 155 with the surface of the line or electrode is larger than 75°, when a pixel electrode (not shown) is formed on the protection layer 150 later, the pixel electrode may be cut within the contact hole 155 formed in the protection layer 150 due to step covering characteristics. To prevent the pixel electrode from being cut within the contact hole 155, the inner side surface of the contact hole 150 may form an angle θ of about 75° or less with the surface of the line or electrode that is exposed through the contact hole 155.

In this case, the angle of the inner side surface of the contact hole 155, which is affected by oxygen contained in a gas mixture supplied into the chamber 197 during a dry etching process, may be low when the flow rate of oxygen is higher than those of other gases.

In the dry etching process for forming the contact hole 155 in the protection layer 150 formed of silicon nitride, as the flow rate of oxygen used for a gas mixture increases, the inner side surface of the contact hole 155 may have a more tapered structure. However, since the line or electrode exposed through the contact hole 155 is formed of copper or a copper alloy, due to characteristics of the second embodiment, an increase in the flow rate of oxygen used during the dry etching process may cause damage to the exposed surface of the line or electrode.

Accordingly, when fabricating the array substrate 101 including the electrode or line formed of copper or a copper alloy, a taper angle θ (about 75° or less) of the inner side surface of the contact hole 155 may have a trade-off relationship with the prevention of damage to the line in terms of the flow rate of oxygen used in the dry etching process for forming the contact hole 155 in the protection layer 150. During the dry etching of the protection layer 150 according to the second embodiment of the present invention, the ratio of the flow rate of nitrogen trifluoride to the flow rate of oxygen may be adjusted to 1:2.5 to 1:3, particularly, during the first and third dry etching processes using the first gas mixture, so that a taper angle of the inner side surface of the contact hole 155 can be 75° or less, and the surface of the line or electrode formed of copper or a copper alloy can be prevented from being damaged.

Since subsequent processes are the same as in the first embodiment, a description thereof is omitted.

The second embodiment of the present invention also uses nitrogen trifluoride gas instead of sulfur hexafluoride acting as a greenhouse gas, so that the use of sulfur hexafluoride can be inhibited to reduce the emissions of greenhouse gases facilitating global warming.

Furthermore, since the method of fabricating the array substrate 101 according to the second embodiment of the present invention reduces the use of greenhouse gases, it is unnecessary to additionally install a thermal decomposition apparatus for reprocessing sulfur hexafluoride acting as a greenhouse gas into gas having a low GWP, and it is also unnecessary to purchase GDR for allowing the use of greenhouse gases, which will come into effect in 2015. Thus, a rise in the fabrication cost of products may be suppressed.

Embodiment 3

A third embodiment of the present invention provides a method of fabricating an array substrate, which uses a larger amount of sulfur hexafluoride than in the foregoing first and second embodiments, but can reduce the used amount of sulfur hexafluoride as compared with a conventional method of fabricating an array substrate by which a protection layer formed of silicon nitride is dry etched using only sulfur hexafluoride acting as a greenhouse gas.

Since the third embodiment of the present invention differs from the first embodiment except for the dry etching of a protection layer, only a process of patterning the protection layer will be described, and processes of forming other elements will be omitted.

Figure 5:
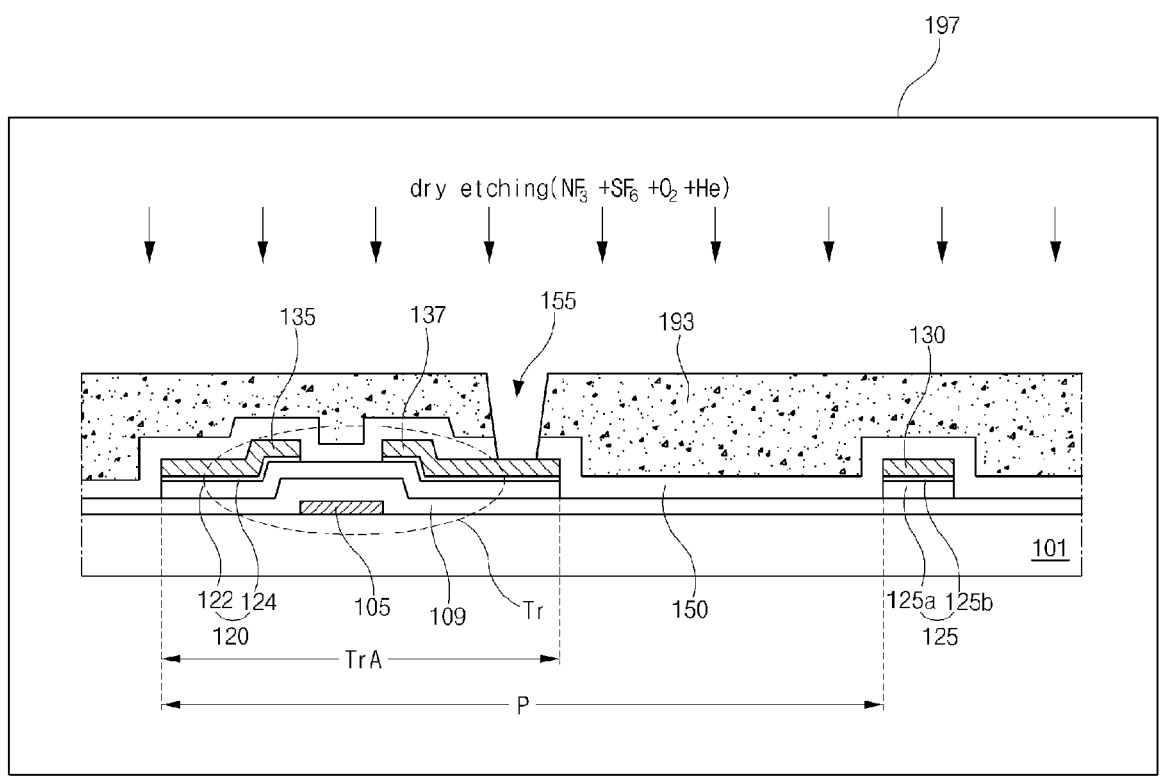
FIG. 5 is a cross-sectional view illustrating a process of forming a contact hole in a protection layer in a method of fabricating an array substrate according to a third embodiment of the present invention.

FIG. 5 is a cross-sectional view illustrating a process of forming a contact hole in a protection layer in the method of fabricating an array substrate 101 according to the third embodiment of the present invention.

As shown in FIG. 5, the method of fabricating the array substrate 101 according to the third embodiment of the present invention may include performing only a first dry etching process on a protection layer 150 unlike in the first embodiment. In this case, a different gas mixture than in the first embodiment may be used during the first dry etching process.

That is, the gas mixture for the dry etching process used in the third embodiment of the present invention may contain sulfur hexafluoride, nitrogen trifluoride, oxygen, and helium. In this case, on analysis of the flow rate of each element per unit time in the gas mixture supplied into the chamber 197 during the dry etching process, the nondimensional ratio of the flow rate of sulfur hexafluoride to the flow rate of nitrogen trifluoride may range from 0.95:1 to 1:0.95; the nondimensional ratio of the flow rates of sulfur hexafluoride and nitrogen trifluoride is defined as a ratio of the flow rate of each element per unit time (expressed in sccm).

In the gas mixture used in the third embodiment, when a data line 130 and source and drain electrodes 135 and 137 are formed of a low-resistance metal other than a copper or a copper alloy, for example, at least one material selected from the group consisting of aluminum, aluminum alloy (e.g., aluminum neodymium), molybdenum, and molybdenum titanium, the total flow rate of nitrogen trifluoride and sulfur hexafluoride may be equal to the flow rate of nitrogen trifluoride contained in the first gas mixture used in the first embodiment, and the flow rates of helium and oxygen may also be equal to the flow rates of helium and oxygen of the first gas mixture used in the first embodiment.

That is, nitrogen trifluoride and sulfur hexafluoride may be supplied at a total flow rate of about 166 sccm to about 186 sccm, helium may be supplied at a flow rate of about 145 sccm to about 155 sccm, and oxygen may be supplied at a flow rate of about 522 sccm to about 698 sccm. In this case, since the ratio of the flow rate of sulfur hexafluoride to the flow rate of nitrogen trifluoride ranges from 0.95:1 to 1:0.95, sulfur hexafluoride may be substantially supplied at a flow rate of about 79 sccm to about 98 sccm.

In the method of fabricating the array substrate 101 according to the third embodiment of the present invention, when the data line 130 and the source and drain electrodes 135 and 137 include a single layer formed of copper or a copper alloy, or include a multilayered structure having an upper layer formed of copper or a copper alloy, the total flow rate of nitrogen trifluoride and sulfur hexafluoride may be equal to the flow rate of nitrogen trifluoride contained in the first gas mixture used in the second embodiment, and the flow rates of helium and oxygen also may be equal to the flow rates of helium and oxygen contained in the first gas mixture used in the second embodiment.

That is, nitrogen trifluoride and sulfur hexafluoride may be supplied at a total flow rate of about 166 sccm to about 186 sccm, helium may be supplied at a flow rate of about 145 sccm to about 155 sccm, and oxygen may be supplied at a flow rate of about 417 sccm to about 558 sccm. In this case, since the ratio of the flow rate of sulfur hexafluoride to the flow rate of nitrogen trifluoride ranges from 0.95:1 to 1:0.95, sulfur hexafluoride may be substantially supplied at a flow rate of about 79 sccm to about 98 sccm.

In the method of fabricating the array substrate 101 according to the third embodiment of the present invention, about 50% of the amount of greenhouse gas used may be reduced as compared with a conventional method of fabricating an array substrate including a dry etching process using sulfur hexafluoride alone as a main reactive gas.

In the dry etching of the protection layer 150 according to the third embodiment of the present invention, it was experimentally demonstrated that a dry etch rate was higher than in the conventional method using sulfur hexafluoride alone as a main reactive gas. This synergy may be due to the mixture of sulfur hexafluoride with nitrogen trifluoride.

When other conditions (e.g., the degree of vacuum in the chamber 197, applied power, and flow rates of reactive gases (e.g., helium and oxygen) other than the main reactive gas) were maintained constant, a protection layer was etched at an etch rate of about 75 Å/sec due to a conventional dry etching process using sulfur hexafluoride as a reactive gas, while the protection layer 150 was etched at an etch rate of about 88 Å/sec due to the dry etching process according to the third embodiment of the present invention. Therefore, it can be seen that the dry etch rate of the protection layer 150 (or the rate at which the thickness of the protection layer 150 was reduced) was improved by as much as 13 Å/sec.

Accordingly, the method of fabricating the array substrate 101 according to the third embodiment of the present invention can reduce greenhouse effect, which is a key factor in global warming, as compared with a conventional method of fabricating an array substrate, and improve productivity of a dry etching process per unit time.

According to the embodiments of the present invention as described above, an insulating layer formed of silicon nitride can be patterned by dry etching using nitrogen trifluoride gas instead of sulfur hexafluoride, which is a greenhouse gas accelerating global warming. Thus, the emission of greenhouse gases can be reduced.

Furthermore, since the present invention reduces the use of greenhouse gases, it is unnecessary to additionally install a thermal decomposition apparatus for reprocessing sulfur hexafluoride, and it is also unnecessary to purchase GDR for allowing the use of greenhouse gases, which will come into effect in 2015. Thus, a rise in the fabrication cost of products may be suppressed.

In the present invention, a dry etching process may be performed using nitrogen trifluoride gas as a reactive gas at about the same etch rate as sulfur hexafluoride gas. Also, factors in causing a drop in etch rate with an increase in accumulated dry etched amount may be removed, thereby improving productivity per unit time.

In addition, since damage to the surfaces of lines or electrodes formed of copper or a copper alloy used to embody large-area display devices can be suppressed, fabrication failures can be reduced.

Moreover, when a mixture of nitrogen trifluoride and sulfur hexafluoride is used as a main reactive gas for a dry etching process, dry etch rate per unit time can be improved as compared with the conventional case in which sulfur hexafluoride alone is used as a main reactive gas.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A method of fabricating an array substrate, comprising:
    forming a line or an electrode on a substrate on which a pixel region is defined;
    forming a protection layer on the line or the electrode, the protection layer formed of silicon nitride ($SiN_x$);
    forming photoresist patterns on the protection layer;
    loading the substrate having the photoresist patterns into a chamber of a dry etching apparatus, and performing a first dry etching process on the protection layer exposed between the photoresist patterns using a first gas mixture containing helium (He), nitrogen trifluoride ($NF_3$), and oxygen ($O_2$), a ratio of nondimensional flow rates of which ranges from 1:1.15:2.875 to 1:1.2:3.6, or 1:1.15:3.6 to 1:1.2:4.5, to form a contact hole exposing the line or the electrode, wherein the nondimensional ratio of the flow rates is defined as a ratio of the flow rate of the helium, the nitrogen trifluoride, and the oxygen per unit time to the ratio of the helium per unit time as expressed in sccm; and
    performing a second dry etching process for a second amount of time by replacing the first gas mixture with a second gas mixture containing nitrogen trifluoride ($NF_3$) and oxygen ($O_2$) without helium (He) after performing the first dry etching process for a first amount of time; and
    performing a third dry etching process for a third amount of time by replacing the second gas mixture with the first gas mixture after performing the second dry etching process,
    wherein the first, second, and third dry etching processes prevent a drop in etch rate of the protection layer over time, and
    wherein the flow rate of the helium during the first and third dry etching processes ranges from about 145 sccm to about 155 sccm.

2. The method according to claim 1, wherein the ratio of the flow rates of helium (He), nitrogen trifluoride ($NF_3$), and oxygen ($O_2$) ranges from 1:1.15:2.875 to 1:1.2:3.6, and the line or the electrode includes a single layer formed of copper (Cu) or a copper alloy, or includes a multilayered structure having an uppermost layer formed of copper or a copper alloy.

3. The method of claim 1, wherein each of the first and third amounts of time is about two to three times as long as the second amount of time, and the second amount of time ranges from 15 seconds to 20 seconds.

4. The method of claim 1, wherein in the second gas mixture supplied into the chamber during the second dry etching process, a ratio of a flow rate of nitrogen trifluoride ($NF_3$) to a flow rate of oxygen ($O_2$) of the second gas mixture ranges from 1:10 to 1:11.

5. The method of claim 4, wherein the flow rate of oxygen ($O_2$) supplied into the chamber during the second dry etching process is equal to the flow rate of oxygen ($O_2$) supplied during the first dry etching process, and the flow rate of nitrogen trifluoride ($NF_3$) during the second dry etching process ranges from about 47 sccm to about 59 sccm.

6. The method of claim 1, wherein an inner side surface of the contact hole forms a tapered structure with respect to the surface of the line or the electrode, and an angle formed by the inner side surface of the contact hole with the surface of the line or the electrode ranges from about 45° to about 75°.

7. The method of claim 1, wherein the forming of the line or the electrode on the substrate on which the pixel region is defined, comprises:
    depositing a first metal material on the substrate, and patterning the first metal material to form a gate line extending in one direction and form a gate electrode in the pixel region;
    forming a gate insulating layer on the gate line and the gate electrode; and
    forming a data line on the gate insulating layer to intersect the gate line and define the pixel region and simultaneously, forming a semiconductor layer and source and drain electrodes to correspond to the gate electrode, the source and drain electrodes formed apart from each other on the semiconductor layer.

* * * * *